United States Patent [19]
Ito

[11] Patent Number: 4,716,513
[45] Date of Patent: Dec. 29, 1987

[54] BASE DRIVE CIRCUIT IN A TRANSISTOR INVERTER
[75] Inventor: Tomotaka Ito, Aichi, Japan
[73] Assignee: Mitsubishi Denki Kabushiki Kaisha, Tokyo, Japan
[21] Appl. No.: 890,047
[22] Filed: Jul. 28, 1986
[30] Foreign Application Priority Data
Jul. 30, 1985 [JP] Japan ................. 60-168111
[51] Int. Cl.[4] ........................... H02M 7/44
[52] U.S. Cl. ..................... 363/97; 363/56; 323/289
[58] Field of Search .......... 363/56, 95, 96, 97, 363/98; 307/270; 323/289
[56] References Cited
U.S. PATENT DOCUMENTS
4,220,987 9/1980 Rao et al. ............. 323/289
4,595,977 6/1986 von der Ohe ............ 363/56
4,638,240 1/1987 Panker et al. ............ 323/289

FOREIGN PATENT DOCUMENTS
58-28292 2/1983 Japan .

Primary Examiner—Peter S. Wong
Assistant Examiner—Judson H. Jones
Attorney, Agent, or Firm—Sughrue, Mion, Zinn, Macpeak & Seas

[57] ABSTRACT

A base drive circuit in a transistor inverter in which a control circuit controls the direction of current flow through an inverter main circuit transistor. Pulses from the control circuit are coupled through a photocoupler to amplifying transistors. A transistor, directly driven by the amplifying transistors, supplies reverse base current to the base of the inverter main inverter circuit transistor in the period immediately following the direct transition 2 Claims, 2 Drawing Figures

BASE DRIVE CIRCUIT IN A TRANSISTOR INVERTER

BACKGROUND OF THE INVENTION

1. Field of the Invention

This invention relates to inverters, and more particularly to a transistor inverter base drive circuit.

2. Background Art

FIG. 1 shows the arrangement of a conventional transistor inverter base drive circuit which is used to convert a DC voltage to an AC voltage. In FIG. 2, a first power source 1 supplies a forward base current. There are a photo-coupler 2, base drive transistors 3 through 7, an inverter main circuit transistor 8 (which is in the form of a Darlington transistor), a base current limiting resistor 9, and diodes 10 through 18. A second power source 19 supplies a reverse base current. There are further a capacitor 20, an inductor 21 and resistors 22 through 32.

The operation of the transistor inverter base drive circuit thus organized will now be described.

A pulse signal is provided by a control circuit P to control the switching of the transistor 8 in order to switch the direction of current flow, thus converting a DC voltage to an AC voltage. This pulse signal is transmitted through the photocoupler 2 to drive the PNP transistor 3 and the NPN transistor 4 which are provided at the rear stage of the photocoupler 2. The NPN transistor 5 is connected as a rear stage to the transistor 4 so that the transistor 3 and 5 operate as a complementary pair. That is, when the transistor 3 is rendered condutive (on), the transistor 5 is rendered non-conductive (off), and vice versa.

The case where the transistor 3 is conductive will be described. The base current $IB_1$ of the inverter main circuit transistor 8 flows from the power source 1 through the transistor 3, the resistor 9, the diode 10, the transistor 7 and the inductor 21 to the base of the transistor 8, and returns through the series of diodes 11–16 to the power source 1. In this operation, a forward voltage corresponding to the six diodes 11–16 is charged in the parallel capacitor 20.

When the application of the pulse signal from the control circuit P is suspended, the transistor 3 is rendered non-conductive (off) while the capacitor 20 is discharged through the transistor 8, the inductor 21, the transistor 7, the transistor 6, the resistor 28 and the transistor 5. At the same time, the transistor 6 is turned on, and a reverse bias current $IB_2$ flows from the power source 19 to the transistor 8 and the transistor 7, thus rendering the transistor 7 non-conductive (off). In this operation, the diode 18 serves as a bypass after the transistor 7 is turned off.

The conventional transistor inverter base drive circuit is organized as described above. Therefore, it is necessary that the voltage required for rendering the transistor 6 conductive (on) is charged in the capacitor 20, and the forward voltage drop of the diodes 11 through 16 connected in parallel to the capacitor 20 is utilized for the charging of the capacitor 20. Therefore, it is necessary to use a relatively large number of diodes 11–16. Therefore, the circuit is intricate, and the forward current flowing in the diodes generates heat. That is, the circuit has a low thermal reliability.

SUMMARY OF THE INVENTION

Accordingly, an object of this invention is to eliminate the above-described difficulties accompanying a conventional transistor inverter base drive circuit.

More specifically, an object of the invention is to provide a transistor inverter base drive circuit high in thermal reliability in which the circuit is simplified by eliminating the capacitor 20 and the diodes 11 through 16 which, in the conventional circuit, are used to render the transistor 6 conductive (on). Thereby the number of heat generating components would be decreased.

A base drive circuit in a transistor inverter according to the invention is so designed that a transistor 6 for applying a reverse bias current to an inverter main circuit transistor is driven directly by an amplifying transistor which is provided at the rear stage of a photocoupler 2 adapted to transmit, in an insulating manner, the output pulse signal of a control circuit.

As was described above, in the base drive circuit according to the invention, the transistor for applying a reverse bias current to the inverter main circuit transistor is driven directly by the amplifying transistor provided at the rear stage of the photocoupler. Therefore, the base drive circuit can be simplified in arrangement and thus can be miniaturized. Furthermore, the number of heat generating components can be decreased to thereby improve the reliability of the circuit.

DETAILED DESCRIPTION OF THE PREFERRED EMBODIMENTS

Figure 1:
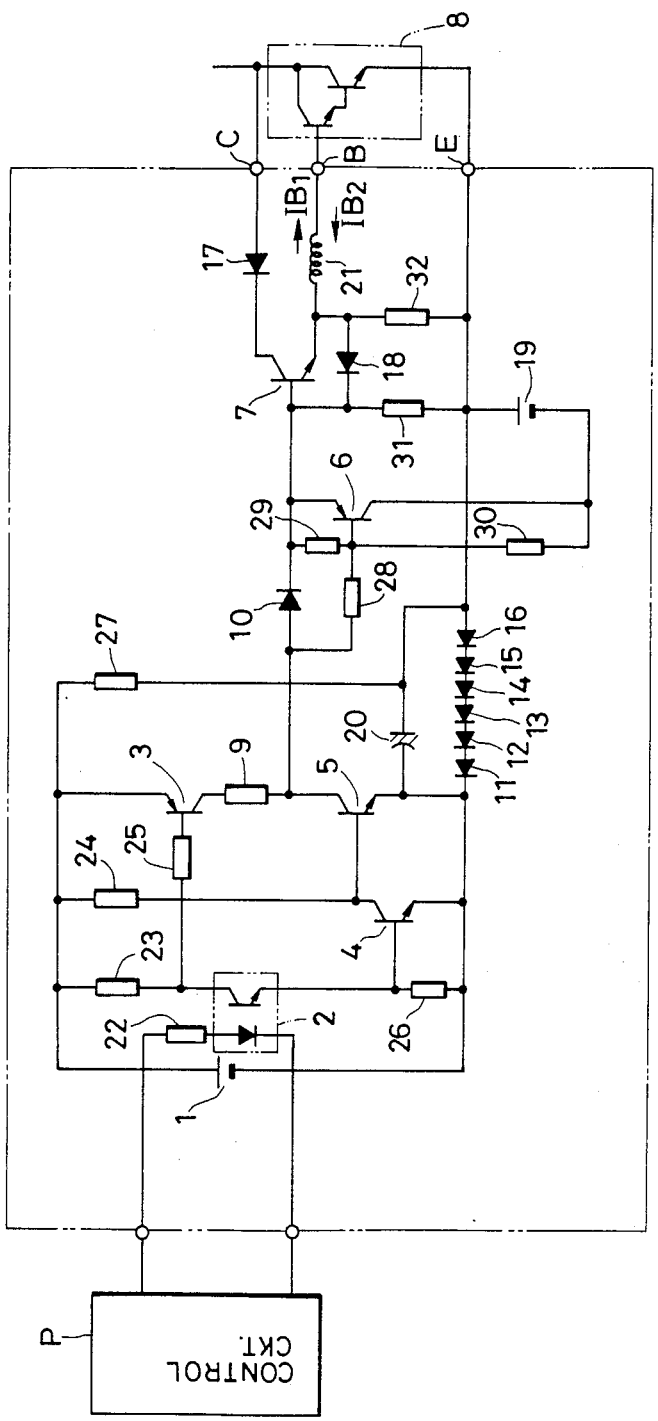
FIG. 1 is a circuit diagram showing a conventional transistor inverter base drive circuit.
Figure 2:
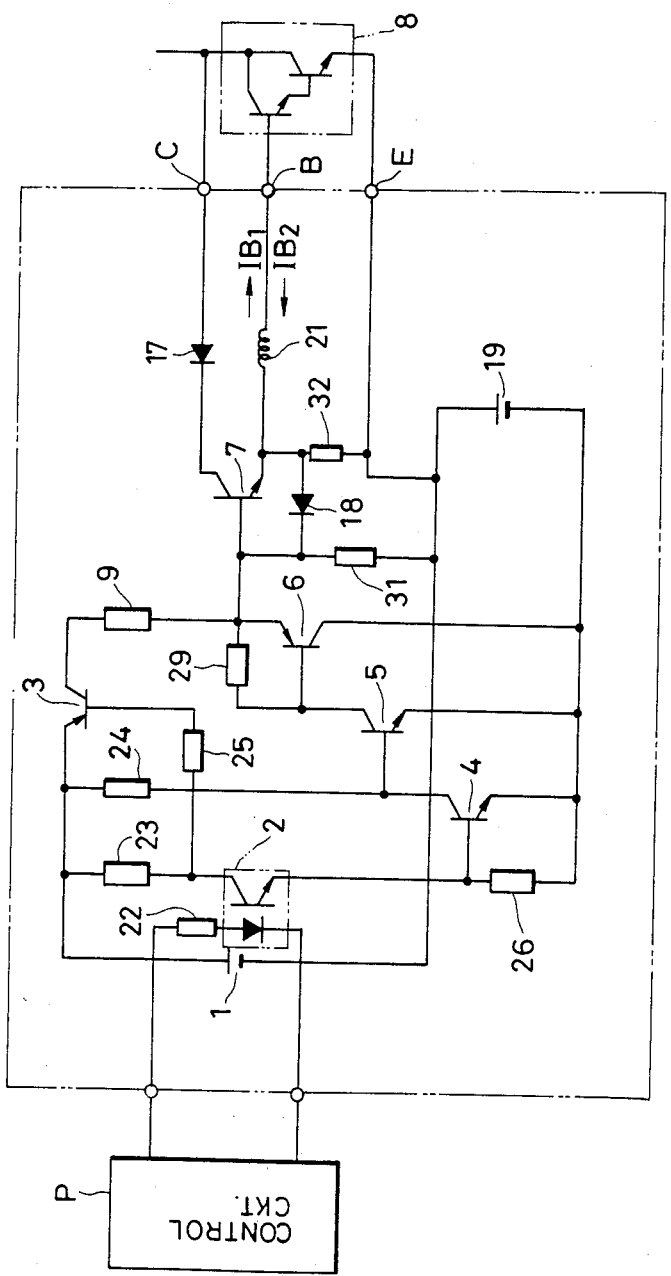
FIG. 2 is a circuit diagram showing one example of a transistor inverter base drive circuit according to this invention.

One embodiment of this invention will be described with reference to FIG. 2. In FIG. 2, those components which have been already described with reference to FIG. 2 are therefore designated by the same reference numerals. As is apparent from comparison of FIG. 2 with FIG. 1, the diodes 10 through 16, the capacitor 20 and the resistors 27, 28 and 30 are eliminated according to the invention. Also, the transistor 6 to which the reverse bias current is applied is driven directly by the amplifying transistor 5 connected at the rear stage of the photocoupler 2.

The operation of the transistor inverter base drive circuit thus organized according to the invention will be described.

A pulse signal outputted by the control circuit P is transmitted through the photocoupler 2 to render the first and second transistors 3 and 4 conductive which are connected to the output terminals of the photocoupler 2. The third or amplification transistor 5 is provided at the rear stage of the second transistor 4. The third transistor 5 is used to amplify the pulse signal.

The fourth transistor 6 is provided at the rear stage of the third transistor 5, to apply the reverse bias current $IB_2$ to the inverter main circuit 8. Therefore, the first and third transistors 3 and 5 operate as a complementary pair, and the first and fourth transistors 3 and 6 also operate as a complementary pair. When the first transistor 3 is conductive (on) the second transistor 4 is also conductive (on), and therefore the third and fourth transistors 5 and 6 are non-conductive (off). When the first transistor 3 is non-conductive (off), the second transistor 4 is also non-conductive (off), and therefore the third and fourth transistors 5 and 6 are conductive (on).

First, the case will be described for which the photocoupler 2 is rendered conductive by the output pulse signal of the control circuit P, and therefore the first and second transistors 3 and 4 are conductive. In this case, the base current $IB_1$ of the inverter main circuit transistor 8 flows from the positive electrode of the first power source 1 through the first transistor 3, the resistor 9, the base and the emitter of the fifth transistor 7 and the inductor 21 to the base of the transistor 8, and return to the negative electrode of the first power source 1.

In the case where the application of the output pulse signal of the control circuit P is suspended, the photocoupler 2 is rendered non-conductive, and the first and second transistors 3 and 4 are non-conductive (off). Thus, the base voltage of the third transistor 5 is increased, so that the third transistor 5 is rendered conductive (on) and, as a result, the fourth transistor 6 is also rendered conductive (on). Therefore, the base current of the inverter main circuit transistor 8 flows, as a reverse bias current $IB_2$, from the positive electrode of the second power source 19 through the emitter and the base of the transistor 8 and the inductor 21 to the emitter and the base of the fifth transistor 7, to thus render the transistors 7 and 8 non-conductive (off).

As was desribed above, when the application of the output pulse signal of the control circuit P is suspended, the reverse bias current $IB_2$ flows through the inverter main circuit transistor 8 and the fifth transistor 7, so that the charge stored between the base and the emitter of each of the transistors is released. Therefore, when the pulse signal is applied to the photocoupler again, the transistors 7 and 8, since they are not affected by the charge, are quickly rendered conductive (on).

In this case, the second diode 18 serves as a bypass for the reverse bias current $IB_2$ after the fifth transistor 7 is rendered non-condutive. The first diode 17 is to prevent the flow of the base current from the base of the fifth transistor 7 to the collector when the inverter main circuit transistor 8 is overdriven.

As is apparent from the above description, in the transistor inverter base drive circuit of the invention, the fourth transistor 6 is connected directly to the third transistor 5 for amplification to cause the reverse bias current $IB_2$ to flow through the inverter main circuit transistor 8 and the fourth transistor 6. Therefore, in the transistor inverter base drive circuit of the invention, unlike the conventional one, it is unnecessary to employ the capacitor and a number of diodes parallel to the capacitor.

According to the invention, the fourth transistor 6 for applying the reverse bias current is driven directly by the amplifying transistor 4 or 5 which is provided at the rear stage of the photocoupler adapted to transmit the output pulse signal of the control circuit. Therefore, the transistor inverter base drive circuit is simple in arrangement, small in the number of heat generating components, and high in reliability.

What is claimed is:

1. A base drive circuit in a transistor inverter in which a transistor on-off operation is utilized to convert a DC voltage into an AC voltage, comprising:
   a main circuit transistor having a base;
   a control circuit for controlling a direction of current through said main circuit transistor;
   a photocoupler having a rear stage and being rendered on and off by a pulse signal outputted by said control circuit;
   first transistor means (7), coupled to said photocoupler, for supplying base current to said main circuit transistor when said photocoupler is on;
   an amplifying transistor (5) at the rear stage of said photocoupler;
   second transistor means (6), directly driven by an output of said amplifying transistor when said photocoupler is off, for applying a reverse bias current to the base of said main circuit transistor; and
   conductor means, directly connected between said amplifying transistor and said second transistor means, for directly applying said output to said second transistor means.

2. A base drive circuit which comprises:
   a main circuit transistor;
   a control circuit for controlling a direction of current through said main circuit transistor;
   a photocoupler (2) which is rendered conductive and non-conductive by a pulse signal provided by a control circuit;
   first and second transistors (3 and 4) connected to said photocoupler;
   a third transistor (5) provided at a rear stage of said second transistor (4), to amplify an output of said second transistor;
   a fourth transistor (6) having a base connected to a collector of said third transistor and having an emitter connected through a resistor (9) to a collector of said first transistor, said fourth transistor and said first transistor operating complementarily; and
   a fifth transistor (7) having a base connected to a connecting point of said fourth transistor and said resistor, and having a collector connected to a first diode (17), and having a second diode (18) connected between an emitter and said base of said fifth transistor,
   said emitter of said fifth transistor (7) being connected through an inductor 21 to a base of said main circuit transistor (8),
   said collector of said fifth transistor (7) being connected through said first diode (17) to a collector of said main circuit transistor (8),
   a connecting point of a negative electrode of a first power source (1) and a positive electrode of a second power source (19) being connected to an emitter of said main circuit transistor,
   a positive electrode of said first power source being connected to an emitter of said first transistor,
   a negative electrode of said second power source being connected to emitters of said second and third transistors and to a collector of said fourth transistor.

* * * * *